(12) United States Patent
Lansford et al.

(10) Patent No.: US 6,285,133 B1
(45) Date of Patent: Sep. 4, 2001

(54) ION IMPLANTER WITH MULTI-LEVEL VACUUM

(75) Inventors: Christopher H. Lansford; Jeremy S. Lansford, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/593,991

(22) Filed: Jun. 14, 2000

(51) Int. Cl.$^7$ .................................................. H01J 7/24
(52) U.S. Cl. .................. 315/111.81; 315/111.21; 315/111.91; 313/359.1; 210/198.2; 438/692
(58) Field of Search .................... 315/111.21, 111.81, 315/111.91; 438/692; 210/198.2

(56) References Cited

U.S. PATENT DOCUMENTS

| | | | |
|---|---|---|---|
| 4,363,774 | * 12/1982 | Bennett | 376/105 |
| 5,298,835 | * 3/1994 | Muehlberger et al. | 315/111.91 |
| 5,362,964 | 11/1994 | Knowles et al. | 250/310 |
| 5,396,067 | 3/1995 | Suzuki et al. | 250/310 |
| 5,442,183 | 8/1995 | Matsui et al. | 250/441.11 |
| 5,828,064 | 10/1998 | Knowles | 250/310 |
| 5,973,447 | * 10/1999 | Mahoney et al. | 313/359.1 |

OTHER PUBLICATIONS

Stanley Wolf and Richard N. Tauber; *Silicon Processing for the VLSI Era, vol. 1–Process Technology*; pp. 308–317; 1986.

FEI Company; *Scanning Electron Microscopes*, FEI Website, www.feic.com; pp 1–4; 2000.
FEI Company; *Signal Detection–BSE only*, FEI Website, www.feic.com; pp. 1–4; 2000.
FEI Company; *What is an ESEM?*, FEI Website, www.feic.com; pp. 1–7; 2000.

* cited by examiner

*Primary Examiner*—Don Wong
*Assistant Examiner*—Jimmy Vu
(74) *Attorney, Agent, or Firm*—Timothy M. Honeycutt

(57) ABSTRACT

Various embodiments of an ion implantation apparatus are provided. In one aspect, an apparatus for implanting a workpiece with ions is provided that includes a housing enclosing a first chamber. A source of accelerated ions is provided for directing a beam of ions through the first chamber toward the workpiece. A second chamber is provided for holding the workpiece along with a plurality of longitudinally spaced chambers that are defined by the housing and a plurality of longitudinally spaced bulkheads. Each of the bulkheads has an aperture enabling fluid communication between the plurality of longitudinally spaced chambers and the passage of the beam of ions. A source of gas is coupled to the second chamber. A pumping system is provided for evacuating the first chamber, the second chamber and the plurality of longitudinally spaced chambers. The pumping system and the plurality of longitudinally spaced chambers provide an increase in pressure between the first chamber and the second chamber. The higher pressure level in the second chamber enables the gas to be present in the second chamber in sufficient quantities to impact the workpiece and neutralize charge building thereon. Charge buildup during implantation is reduced.

32 Claims, 3 Drawing Sheets

ION IMPLANTER WITH MULTI-LEVEL VACUUM

BACKGROUND OF THE INVENTION

1. Field of the Invention

This invention relates generally to semiconductor fabrication, and more particularly to an apparatus for implanting ions that incorporates multiple vacuum chambers.

2. Description of the Related Art

Ion implantation has been used for many years as a means of adding impurity ions into the surfaces of semiconductor wafers and various circuit structures implemented thereon.

In general, ion implantation involves the bombardment of a targeted surface with energetic charged atoms or molecules. During implantation, secondary electrons and other charged species are ejected from the targeted surface. This exodus of negatively charged particles from the targeted surface can lead to a positive charge buildup, particularly where the targeted surface is an insulating film or a polycrystalline silicon film positioned on an underlying oxide film. The positive charge buildup can alter the charge balance in the ion beam and lead to significant dose variations across the substrate. In some circumstances, the charge buildup may damage the surface of the substrate by inducing microscopic craters via oxide breakdown and degrade the transconductance and subthreshold characteristics of the semiconductor device.

One conventional method for addressing the problem of positive charge buildup during implantation involves the use of an electron flood gun. The electron flood gun directs a stream of low energy electrons at the substrate during implantation. The purpose of the low energy electron stream is to neutralize positive charge buildup. In order to attract the flood gun electron beam to the substrate surface, the substrate must be biased relative to the flood gun beam, normally at about 3 to 4 volts for various types of implanters. Depending upon the geometry of the implanted structures, this bias can lead to the trapping of both positive and negative charges, at locally high levels, particularly near edge structures, such as the edges of a gate electrode and the edges of an underlying gate oxide film.

Typical conventional implanters include an ion source and an ion accelerator and a wafer chamber. The wafer chamber and the enclosures for the accelerator and ion source are pumped down to a relatively high vacuum. Pressure levels of $10^{-6}$ torr or lower are typical. The high vacuum is used to minimize the formation of neutrals by collision of beam ions with residual gas atoms. Thus, the conventional implanter contemplates substantial evacuation and thus very low pressures in the wafer chamber and thus very low concentrations of atomic species that might otherwise be utilized to interact with the wafer surface and neutralize charge buildup.

The present invention is directed to overcoming or reducing the effects of one or more of the foregoing disadvantages.

SUMMARY OF THE INVENTION

In accordance with one aspect of the present invention, an apparatus for implanting a workpiece with ions is provided that includes a first chamber and a source of accelerated ions for directing a beam of ions through the first chamber toward the workpiece. A second chamber is provided for holding the workpiece. A first bulkhead is positioned between the first chamber and the second chamber and has an aperture enabling fluid communication between the first chamber and the second chamber and the passage of some of the ions therethrough. A first pump is coupled to the first chamber for reducing pressure in the first chamber. A source of gas is coupled to the second chamber. A second pump is coupled to the second chamber for reducing pressure in the second chamber to a higher level than in the first chamber. The higher pressure level in the second chamber enables the gas to be present in the second chamber in sufficient quantities to impact the workpiece and neutralize charge building thereon.

In accordance with another aspect of the present invention, an apparatus for implanting a workpiece with ions is provided that includes a first chamber, a second chamber, a third chamber, and a fourth chamber for holding the workpiece. A source of accelerated ions is provided for directing a beam of ions through the first chamber toward the workpiece. A first pump is coupled to the first chamber for reducing pressure in the first chamber. A first bulkhead is positioned between the first chamber and the second chamber and has a first aperture enabling fluid communication between the first chamber and the second chamber and the passage of some of the ions therethrough. The first aperture restricts the flow of gas therethrough whereby the pressure level in the second chamber is higher than in the first chamber. A second bulkhead is positioned between the second chamber and the third chamber and has a second aperture enabling fluid communication between the second chamber and the third chamber and the passage of some of the ions therethrough. The second aperture restricts the flow of gas therethrough whereby the pressure level in the third chamber is higher than in the second chamber. A third bulkhead is positioned between the third chamber and the fourth chamber and has a third aperture enabling fluid communication between the third chamber and the fourth chamber and the passage of some of the ions therethrough. The third aperture restricts the flow of gas therethrough whereby the pressure level in the fourth chamber is higher than in the third chamber. A source of gas is coupled to the fourth chamber. A second pump is coupled to the fourth chamber for reducing pressure in the fourth chamber. The higher pressure level in the fourth chamber enables the gas to be present in the fourth chamber in sufficient quantities to impact the workpiece and neutralize charge building thereon.

In accordance with another aspect of the present invention, an apparatus for implanting a workpiece with ions is provided that includes a housing enclosing a first chamber. A source of accelerated ions is provided for directing a beam of ions through the first chamber toward the workpiece. A second chamber is provided for holding the workpiece along with a plurality of longitudinally spaced chambers that are defined by the housing and a plurality of longitudinally spaced bulkheads. Each of the bulkheads has an aperture enabling fluid communication between the plurality of longitudinally spaced chambers and the passage of the beam of ions. A source of gas is coupled to the second chamber. A pumping system is provided for evacuating the first chamber, the second chamber and the plurality of longitudinally spaced chambers. The pumping system and the plurality of longitudinally spaced chambers provide an increase in pressure between the first chamber and the second chamber. The higher pressure level in the second chamber enables the gas to be present in the second chamber in sufficient quantities to impact the workpiece and neutralize charge building thereon.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
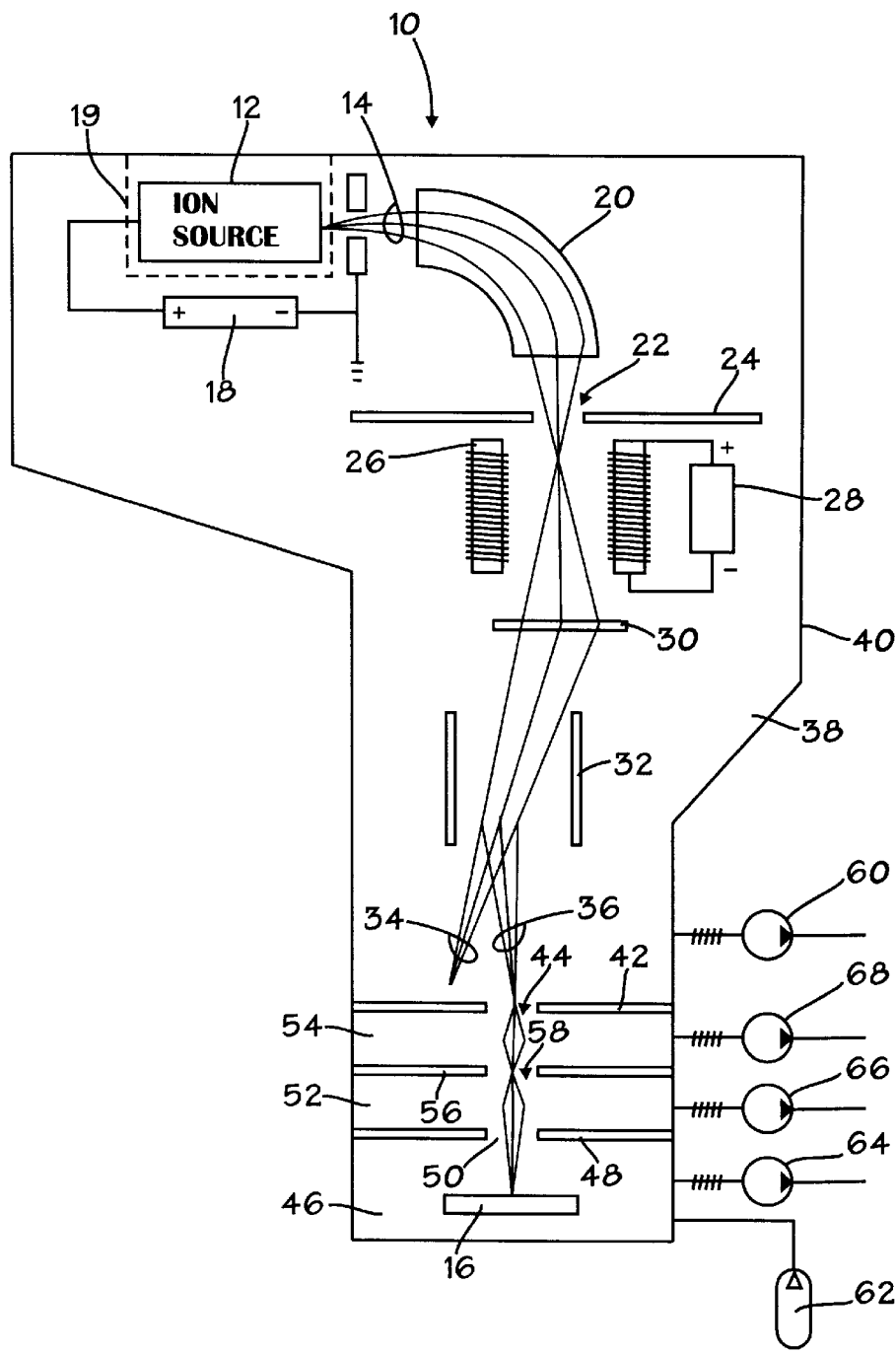
FIG. 1 is a schematic view of an exemplary embodiment of an ion implantation apparatus in accordance with the present invention.

In the drawings described below, reference numerals are generally repeated where identical elements appear in more than one figure. Turning now to the drawings, and in particular to FIG. 1, therein is shown a schematic view of an exemplary embodiment of an ion implantation apparatus 10 (hereinafter "implanter 10"). The implanter 10 includes an ion source 12 that is capable of providing a beam 14 of ions for implantation into a workpiece 16, such as a semiconductor wafer. The ion source 12 includes not only a source of the implantation species but also an apparatus, such as an arc discharge, a hot cathode, a cold cathode or the like to ionize the feed gas and produce a plasma. Power for the ion source 12 is provided by a power supply 18. The ion source 12 may be enclosed in a separate vacuum chamber 19 (shown in dashed line) maintained about $10^{-2}$ to $10^5$ torr to facilitate plasma excitation. An analyzing magnet 20 is provided in order to receive the incoming beam 14 and select only the ion species of interest according to its mass while rejecting all others. The incident beam 14 is spatially separated into several beams according to ionic mass with only the species of interest achieving a sufficient radius of curvature to pass through a resolving aperture 22 in a plate 24. The plate 24 is advantageously fabricated from materials that have relatively low sputtering yields and that present acceptably low potential for damage to semiconductor materials, such as silicon. Exemplary materials include, for example, graphite, aluminum, platinum, stainless steel, ceramics or the like.

An accelerator 26 is provided for creating an acceleration field to increase the energy of the ions passing through the aperture 22 or to decelerate the ions if energies less than the extracted voltage are required. The accelerator 26 in the illustrated embodiment is configured as an acceleration tube with a power supply 28.

After passing through the acceleration tube 26, the beam 14 is focused to a desired dimension and shape by a focusing coil 30. The beam 14 is next passed through a neutral beam trap and beam gate 32, which separates non-ionized particles 34 from the ion species of interest 36.

The analyzing magnet 20, the accelerator 26, the focusing coil 30, and the neutral beam trap 32 are all enclosed within a chamber 38 that is defined by a housing 40 and a bulkhead 42. The ion source chamber 19 may or may not be positioned within the chamber 38. The bulkhead 42 includes an aperture 44 that functions as a pressure limiting orifice. The workpiece 16 is positioned in a chamber 46 that is defined by the housing walls 40 and a bulkhead 48. Like the bulkhead 42, the bulkhead 48 is provided with an aperture 50. Two additional chambers 52 and 54 are interposed between the chamber 38 and the chamber 46. The chamber 52 is defined by the walls of the housing 40, the bulkhead 48 and a bulkhead 56. The chamber 54 is defined by the walls of the housing 40 and the bulkheads 42 and 56. Like the bulkheads 42 and 48, the bulkhead 56 is provided with an aperture 58. The apertures 44, 58 and 50 are generally concentrically aligned so that the ion beam 36 may pass directly through and strike the workpiece 16.

As the skilled artisan will appreciate, it is desirable to maintain the pressure in the chamber 38 at a relatively high vacuum level, such as in the $10^{-6}$ to $10^{-8}$ torr region. In this regard, a high vacuum pump 60 is coupled to the chamber 38. Various types of high vacuum pumps may be suitable for the pump 60, such as, for example, cryopumps, ion pumps, diffusion pumps, turbo molecular pumps or the like. The pressure in the chamber 46 is advantageously considerably higher than in the chamber 38. The purpose for the quite large pressure differential between the chambers 38 and 46 is to enable a gaseous species supplied from a gas reservoir 62 to flow into and be present in the chamber 46 in sufficient quantities to provide substantial numbers of molecular collisions with the workpiece 16 and thereby neutralize charge buildup on the surface of the workpiece 16. It is anticipated that the chamber 46 may be advantageously maintained at about 0.1 to 10 torr. A vacuum pump 64 is coupled to the chamber 46 and works in concert with the pressure limiting apertures 50 and 44 to maintain the desired pressure level within the chamber 46. The chambers 52 and 54 are respectively coupled to vacuum pumps 66 and 68 which act in concert with the pressure limiting apertures 50, 58 and 44 to maintain the pressure in the chambers 52 and 54 at the desired levels.

The provision of the intermediary chambers 52 and 54 provides for the graduated ramping up of pressure from the very high vacuum state in the chamber 38 to the relatively low vacuum pressure state in the chamber 46. In an exemplary embodiment, the pressure in the chamber 54 is about one hundred to one thousand times greater than in the chamber 38, and the pressure in the chamber 52 is about one hundred to one thousand times greater than in the chamber 54. Thus, in an exemplary embodiment, the pressure in the chamber 38 may be about $10^{-7}$ torr, the pressure in the chamber 54 may be about $10^{-5}$ torr, the pressure in the chamber 52 may be about $10^{-3}$ torr and the pressure in the chamber 46 may be about 1 torr.

As noted above, the pressure in the chamber 46 is advantageously maintained at a high enough level to enable a gaseous species to be introduced from the gas reservoir 62. The gaseous species is introduced into the chamber 46 and through molecular collisions with the workpiece 16, neutralizes charge buildup due to the ion beam 36. The gas is advantageously a chemically inert species such as, for example, argon, krypton, helium or the like. If desired, the gaseous species may be ionized prior to introduction into the chamber 46.

Various optional components have not been shown for simplicity of illustration. However, the skilled artisan will appreciate that the implanter 10 may be fitted with additional components as desired, such as, for example, additional focusing and rastering magnets, workpiece translation components, and dose measurement detectors.

Figure 2:
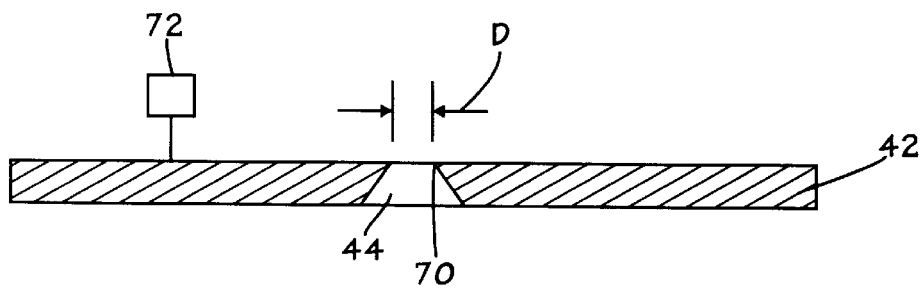
FIG. 2 is a cross-sectional view of an exemplary bulkhead of the implantation apparatus of FIG. 1 in accordance with the present invention.
Figure 3:
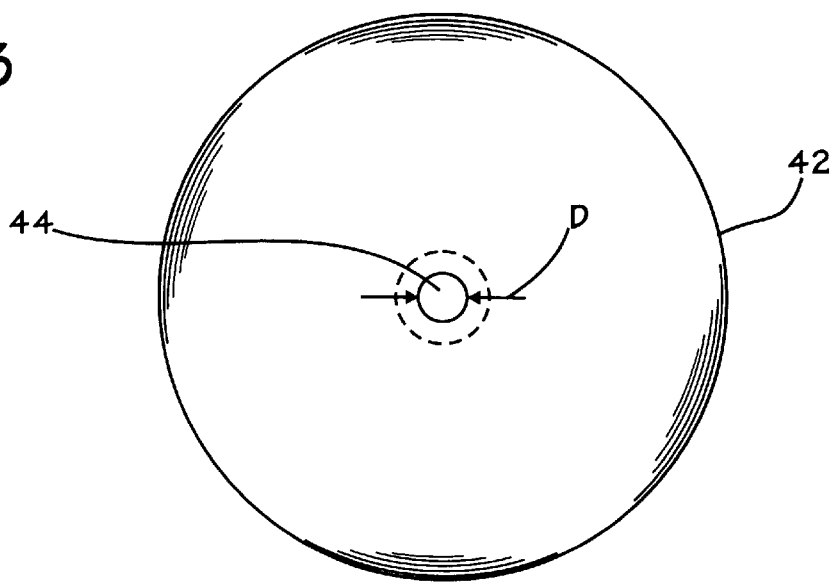
FIG. 3 is an end view of the bulkhead shown in FIG. 2 in accordance with the present invention.

The detailed structure of an exemplary embodiment of the bulkhead 42 and the aperture 44 may be understood by referring now to FIGS. 2 and 3. FIG. 2 is a cross-sectional view of the bulkhead 42 and FIG. 3 is an end view of the bulkhead 42. As shown in FIG. 2, the aperture 44 is annular and presents a knife edge 70 toward the incident beam 36. The knife edge 70 is established by providing the aperture 44 with a conical configuration with an inlet diameter D and an exit diameter that is larger than D. Other than annular shapes are envisioned. The shape of the bulkhead 42 will depend upon the configuration of the housing 40. In the illustrative embodiment, the bulkhead 42 is provided with a generally circular shape as shown in FIG. 3. The bulkhead 42 is advantageously composed of the same types of materials used to fabricate the focusing plate 24 shown in FIG. 1. To keep aperture 44 free of contamination, heat may be applied to the aperture by heating source 72 that may be an ohmic heating element or the like. The diameter D of the aperture 44 determines the maximum beam width that is allowed to pass through and the pressure level within the chambers adjacent to the bulkhead 42 in conjunction with the various pumps. In an exemplary embodiment, the diameter D of the aperture 44 is about 2 to 10 $\mu$m. The diameters of the other apertures 58 and 50 may be the same as the diameter D or larger or smaller depending upon the capacities of the pumps 60, 64, 66 and 68 and the desired pressure levels within the chambers 38, 46, 52 and 54.

Figure 4:
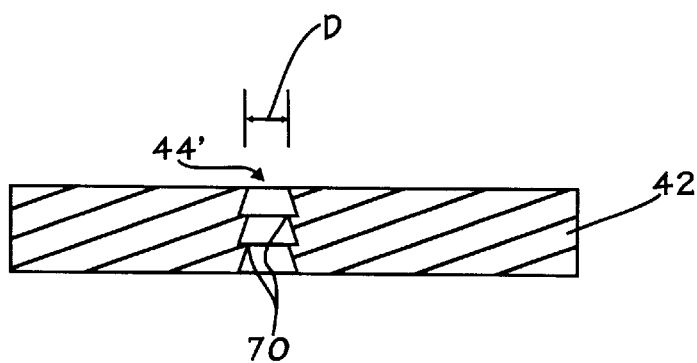
FIG. 4 is a cross-sectional view like FIG. 2 of an alternate exemplary bulkhead of the implantation apparatus of FIG. 1 in accordance with the present invention.

An alternate exemplary embodiment of the bulkhead, now designated 42', may be understood by referring now to FIG. 4. In this illustrative embodiment, the aperture, now designated 44', may be provided with multiple, concentric, longitudinally spaced knife edges 70, each with an inlet diameter D and an outlet diameter that is larger than D. This arrangement provides for a greater pressure drop across the bulkhead 42' than a single knife-edged aperture of comparable diameter.

Figure 5:
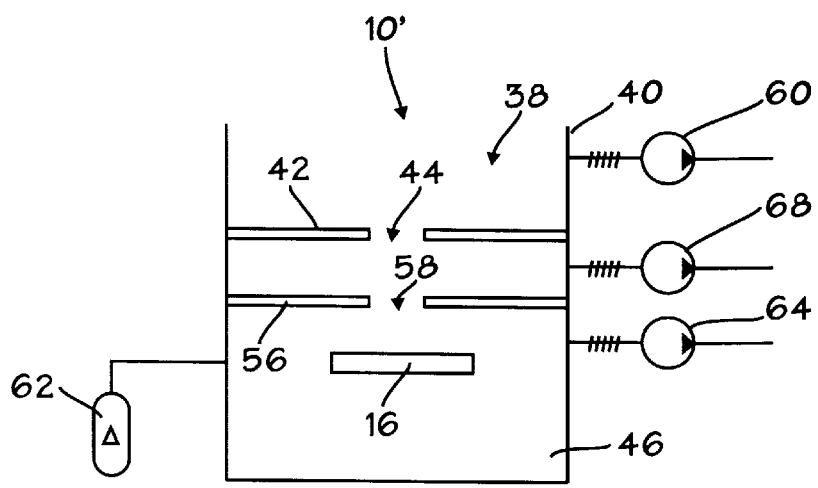
FIG. 5 is a schematic view of another exemplary embodiment of an ion implantation apparatus in accordance with the present invention.

An alternate exemplary embodiment of the implantation apparatus 10' may be understood by referring now to FIG. 5, which is a schematic view similar to FIG. 1 although showing only the lower end of the implantation apparatus 10'. The upper portion of the implantation apparatus 10' may be substantially identical to the embodiment disclosed in FIG. 1. In this illustrative embodiment, only a single chamber 54 is positioned between the chambers 38 and 46. The chamber 54 is defined by the walls of the housing 40 and the bulkheads 42 and 56. The bulkheads 42 and 56 may be configured as described above in conjunction with FIG. 1 and in this regard are provided with respective apertures 44 and 58. Vacuum pumps 60, 68 and 64 are provided to reduce the pressure in the chambers 38, 54 and 46 in conjunction with the pressure limiting activity of the apertures 44 and 58. In this embodiment, the pressure drop between adjacent chambers, such as the chamber 46 and the chamber 52, will be somewhat larger than in the embodiment disclosed in FIG. 1, which incorporates four separate chambers. For example, where it is desired to maintain the pressure in the chamber 38 at about $10^{-9}$ torr, the pressure within the chamber 54 may be maintained at about $10^{-4}$ torr and the pressure in the chamber of 46 at about 1 torr. Again, the establishment of the requisite pressure differentials between chambers is provided by a combination of the diameters of the apertures 44 and 58 and the pumping capacities of the pumps 60, 68 and 64. The workpiece 16 is again enveloped in a gaseous atmosphere supplied by the gas reservoir 62.

Figure 6:
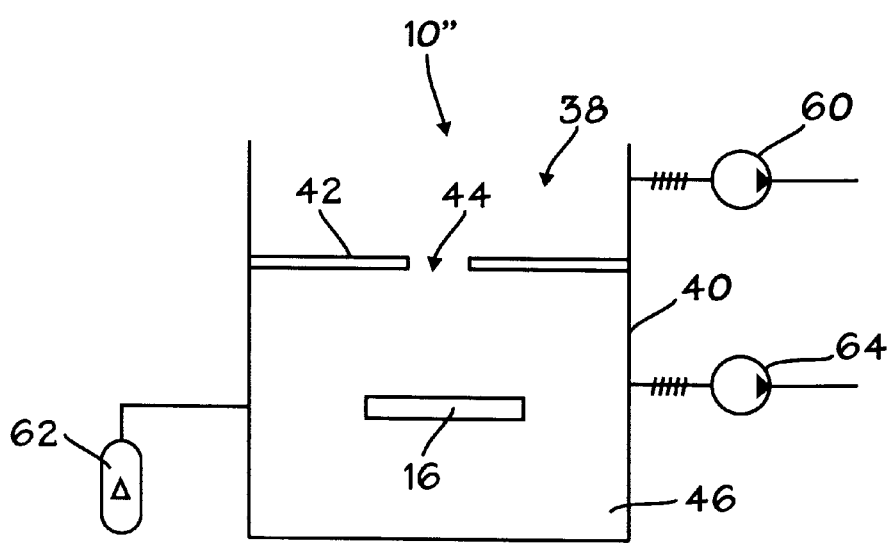
FIG. 6 is a schematic view of another exemplary embodiment of an ion implantation apparatus in accordance with the present invention.

Another alternate exemplary embodiment of the implantation apparatus 10" is shown in FIG. 6 and further illustrates the design flexibility with regard to the number of apertures and vacuum chambers. In this embodiment, the high vacuum chamber 38 is separated from the low vacuum chamber 46 by a single bulkhead 42. The chamber 38 is defined by the walls of the housing 40 and the bulkhead 42. The chamber 46 is similarly defined. The chamber 38 is pumped down by the pump 60 and the chamber 46 is pumped down by the pump 64. The desired gaseous ambient is provided by the gas reservoir 62. The diameter of the aperture 44 is selected in conjunction with the pumping capacities of the pumps 60 and 64 to provide a desired pressure differential between the chamber 38 and the chamber 46 so that the pressure in the chamber 46 is high enough to provide sufficient gas concentration for surface charge neutralization on the workpiece 16. For example, the pressure in the chamber 38 may be set at about $10^{-7}$ torr and the pressure in the chamber 46 may be set to about $10^{-1}$ torr.

FIGS. 5 and 6 illustrate that there is significant flexibility in the number and configuration of the bulkheads, the apertures and the chambers which they define. For example, the flow characteristics of the apertures 44 and 58 depicted in FIG. 5 may be such that the pump 64 can be eliminated and the requisite pressure differentials can be maintained through the action of the apertures 44 and 58 and the pumps 60 and 68 alone. Furthermore, more than four chambers are envisioned wherein the pressure differential between adjacent chambers may be lower than as described in conjunction with FIG. 1.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus for implanting a workpiece with ions, comprising:
   a first chamber;
   a source of accelerated ions for directing a beam of ions through the first chamber toward the workpiece;
   a second chamber for holding the workpiece;
   a first bulkhead positioned between the first chamber and the second chamber and having a first aperture enabling fluid communication between the first chamber and the second chamber and the passage of some of the ions therethrough;
   a first pump coupled to the first chamber for reducing pressure in the first chamber;
   a source of gas coupled to the second chamber; and
   a second pump coupled to the second chamber for reducing pressure in the second chamber to a higher level than in the first chamber, the higher pressure level in the second chamber enabling the gas to be present in the second chamber in sufficient quantities to impact the workpiece and neutralize charge building thereon.

2. The apparatus of claim 1, comprising a second bulkhead positioned between the first bulkhead and the second chamber and defining a third chamber, the second bulkhead having a second aperture enabling fluid communication between the first chamber, the third chamber and the second chamber and the passage of some of the ions therethrough, the second aperture restricting the flow of gas therethrough whereby the pressure level in the third chamber is higher than in the first chamber but lower than in the second chamber.

3. The apparatus of claim 2, comprising a third pump coupled to the third chamber to reduce the pressure therein.

4. The apparatus of claim 2 comprising a third bulkhead positioned between the second bulkhead and the second chamber and defining a fourth chamber, the third bulkhead having a third aperture enabling fluid communication between the first chamber, the third chamber, the fourth chamber and the second chamber and the passage of some of the ions therethrough, the third aperture restricting the flow of gas therethrough whereby the pressure level in the fourth chamber is higher than in the first chamber and the third chamber but lower than in the second chamber.

5. The apparatus of claim 4, wherein the first aperture, the second aperture and the third aperture are annular.

6. The apparatus of claim 4, comprising a comprising a fourth pump coupled to the fourth chamber to reduce the pressure therein.

7. The apparatus of claim 6, wherein the ratios of: (a) the pressure in the first chamber to the pressure in the third chamber; (b) the pressure in the third chamber to the pressure in the fourth chamber; and (c) the pressure in the fourth chamber to the pressure in the second chamber are about $10^{-2}$ to $10^{-3}$.

8. The apparatus of claim 7, wherein the pressure in the second chamber is about 1 torr.

9. The apparatus of claim 1, comprising an accelerator for accelerating the ions.

10. The apparatus of claim 1, wherein the gas comprises argon.

11. The apparatus of claim 1, wherein the gas comprises water.

12. The apparatus of claim 1, wherein the gas is ionized.

13. The apparatus of claim 1, wherein the first aperture comprises a plurality of concentric longitudinally spaced knife edge openings.

14. An apparatus for implanting a workpiece with ions, comprising:

a first chamber, a second chamber, a third chamber, and a fourth chamber for holding the workpiece;

a source of accelerated ions for directing a beam of ions through the first chamber toward the workpiece;

a first pump coupled to the first chamber for reducing pressure in the first chamber;

a first bulkhead positioned between the first chamber and the second chamber and having a first aperture enabling fluid communication between the first chamber and the second chamber and the passage of some of the ions therethrough, the first aperture restricting the flow of gas therethrough whereby the pressure level in the second chamber is higher than in the first chamber;

a second bulkhead positioned between the second chamber and the third chamber and having a second aperture enabling fluid communication between the second chamber and the third chamber and the passage of some of the ions therethrough, the second aperture restricting the flow of gas therethrough whereby the pressure level in the third chamber is higher than in the second chamber;

a third bulkhead positioned between the third chamber and the fourth chamber and having a third aperture enabling fluid communication between the third chamber and the fourth chamber and the passage of some of the ions therethrough, the third aperture restricting the flow of gas therethrough whereby the pressure level in the fourth chamber is higher than in the third chamber;

a source of gas coupled to the fourth chamber; and a second pump coupled to the fourth chamber for reducing pressure in the fourth chamber, the higher pressure level in the fourth chamber enabling the gas to be present in the fourth chamber in sufficient quantities to impact the workpiece and neutralize charge building thereon.

15. The apparatus of claim 14, wherein the first aperture, the second aperture and the third aperture are annular.

16. The apparatus of claim 14, comprising a third pump coupled to the third chamber to reduce the pressure therein.

17. The apparatus of claim 16, comprising a comprising a fourth pump coupled to the second chamber to reduce the pressure therein.

18. The apparatus of claim 14, wherein the ratios of: (a) the pressure in the first chamber to the pressure in the second chamber; (b) the pressure in the second chamber to the pressure in the third chamber; and (c) the pressure in the third chamber to the pressure in the fourth chamber are about $10^{-2}$ to $10^{-3}$.

19. The apparatus of claim 18, wherein the pressure in the fourth chamber is about 1 torr.

20. The apparatus of claim 14, comprising an accelerator for accelerating the ions.

21. The apparatus of claim 14, wherein the gas comprises argon.

22. The apparatus of claim 14, wherein the gas comprises water.

23. The apparatus of claim 14, wherein the gas is ionized.

24. The apparatus of claim 14, wherein at least one of the first, second and third apertures comprises a plurality of concentric longitudinally spaced knife edge openings.

25. An apparatus for implanting a workpiece with ions, comprising:

a housing enclosing a first chamber;

a source of accelerated ions for directing a beam of ions through the first chamber toward the workpiece;

a second chamber for holding the workpiece;

a plurality of longitudinally spaced chambers being defined by the housing and a plurality of longitudinally spaced bulkheads, each of the bulkheads having an aperture enabling fluid communication between the plurality of longitudinally spaced chambers and the passage of the beam of ions;

a source of gas coupled to the second chamber; and a pumping system for evacuating the first chamber, the second chamber and the plurality of longitudinally spaced chambers, the pumping system and the plurality of longitudinally spaced chambers providing an increase in pressure between the first chamber and the second chamber, the higher pressure level in the second chamber enabling the gas to be present in the second chamber in sufficient quantities to impact the workpiece and neutralize charge building thereon.

26. The apparatus of claim 25, wherein each of the plurality of apertures is annular.

27. The apparatus of claim 25, wherein the ratios of: (a) the pressure in the first chamber to the pressure in the first of the plurality of longitudinally spaced chambers; and (b) the pressure in the last of the plurality of longitudinally spaced chambers to the pressure in the second chamber are about $10^{-2}$ to $10^{-3}$.

28. The apparatus of claim 25, wherein the pressure in the second chamber is about 1 torr.

29. The apparatus of claim 25, wherein the gas comprises argon.

30. The apparatus of claim 25, wherein the gas comprises water.

31. The apparatus of claim 25, wherein the gas is ionized.

32. The apparatus of claim 25, wherein at least one of the plurality of apertures comprises a plurality of concentric longitudinally spaced knife edge openings.

* * * * *